(12) United States Patent
Inoue et al.

(10) Patent No.: US 11,359,114 B2
(45) Date of Patent: Jun. 14, 2022

(54) POLISHING METHOD USING CMP POLISHING LIQUID (71) Applicant: Showa Denko Materials Co., Ltd., Tokyo (JP)

(72) Inventors: Keisuke Inoue, Tokyo (JP); Shunsuke Kondo, Tokyo (JP); Yuya Otsuka, Tokyo (JP)

(73) Assignee: SHOWA DENKO MATERIALS CO., LTD., Tokyo (JP)

( * ) Notice: Subject to any disclaimer, the term of this patent is extended or adjusted under 35 U.S.C. 154(b) by 0 days.

(21) Appl. No.: 17/197,991

(22) Filed: Mar. 10, 2021

(65) Prior Publication Data
US 2021/0189179 A1 Jun. 24, 2021

Related U.S. Application Data (62) Division of application No. 16/308,009, filed as application No. PCT/JP2017/021482 on Jun. 9, 2017, now abandoned.

(30) Foreign Application Priority Data

Jun. 9, 2016 (JP) .............................. JP2016-115567

(51) Int. Cl.
*C09G 1/02* (2006.01)
*H01L 21/306* (2006.01)
(Continued)

(52) U.S. Cl.
CPC ................ *C09G 1/02* (2013.01); *B24B 37/00* (2013.01); *C09K 3/14* (2013.01);
(Continued)

(58) Field of Classification Search
None
See application file for complete search history.

(56) References Cited

U.S. PATENT DOCUMENTS

| | | | |
|---|---|---|---|
| 4,944,836 A | 7/1990 | Beyer et al. | |
| 6,080,802 A * | 6/2000 | Emmons | C09D 7/80 523/205 |

(Continued)

FOREIGN PATENT DOCUMENTS

| | | |
|---|---|---|
| JP | H2-278822 A | 11/1990 |
| JP | 2003-173990 A | 6/2003 |

(Continued)

*Primary Examiner* — Allan W. Olsen
(74) *Attorney, Agent, or Firm* — Fitch, Even, Tabin & Flannery, L.L.P.

(57) ABSTRACT

A polishing method includes polishing a substrate with a CMP polishing liquid. The substrate includes a barrier metal, a metal film, and a silicon dioxide film. The metal film includes one or more of copper, copper alloy, copper oxide, or copper alloy oxide. The CMP polishing liquid includes abrasive particles, a metal oxide dissolving agent, an oxidizing agent, a water-soluble polymer, and an alkali metal ion. The pH of the CMP polishing liquid is 7.0 to 11.0. Surface potentials of the abrasive particles and the metal film have the same sign and a product of the surface potential (mV) of the abrasive particles and the surface potential (mV) of the metal film is 300 to 980 mV$^2$ upon polishing the substrate with the CMP polishing liquid.

15 Claims, 2 Drawing Sheets

(51) Int. Cl.
*H01L 21/768* (2006.01)
*C09K 3/14* (2006.01)
*H01L 21/321* (2006.01)
*B24B 37/00* (2012.01)
*H01L 21/3105* (2006.01)

(52) U.S. Cl.
CPC .. *H01L 21/30604* (2013.01); *H01L 21/31053* (2013.01); *H01L 21/3212* (2013.01); *H01L 21/7684* (2013.01)

(56) References Cited

U.S. PATENT DOCUMENTS

| | | | | |
|---|---|---|---|---|
| 6,740,590 | B1 * | 5/2004 | Yano | C09K 3/1463 438/692 |
| 2003/0168627 | A1 * | 9/2003 | Singh | H01L 21/3212 252/79.1 |
| 2005/0118821 | A1 * | 6/2005 | Minamihaba | C09G 1/02 438/691 |
| 2007/0196975 | A1 * | 8/2007 | Nomura | C09G 1/02 438/230 |
| 2007/0232512 | A1 * | 10/2007 | Nishiwaki | C11D 3/3707 510/175 |
| 2008/0105651 | A1 * | 5/2008 | Mabuchi | C09G 1/02 216/89 |
| 2008/0206995 | A1 * | 8/2008 | Tomiga | H01L 21/3212 438/693 |
| 2008/0242090 | A1 * | 10/2008 | Yamada | C09K 3/1436 438/692 |
| 2009/0130849 | A1 * | 5/2009 | Lee | H01L 21/02074 438/693 |
| 2009/0133716 | A1 * | 5/2009 | Lee | H01L 21/02063 134/3 |
| 2011/0081780 | A1 * | 4/2011 | Shida | H01L 21/3212 438/693 |
| 2018/0257194 | A1 * | 9/2018 | Yoshizaki | H01L 21/31053 |

FOREIGN PATENT DOCUMENTS

| | | | |
|---|---|---|---|
| JP | 2007-273621 | A | 10/2007 |
| JP | 2014-069260 | A | 4/2014 |
| JP | 2014069260 | A * | 4/2014 |
| TW | 200944583 | A1 | 11/2009 |
| WO | 01/013417 | A1 | 2/2001 |
| WO | 2007/060869 | A1 | 5/2007 |

* cited by examiner

POLISHING METHOD USING CMP POLISHING LIQUID

CROSS-REFERENCE TO RELATED APPLICATIONS

The present application is a divisional application under 35 U.S.C. § 120 of U.S. Ser. No. 16/308,009 filed on Dec. 7, 2018, which is a National Stage Application under 35 U.S.C. § 371 of International Application No. PCT/JP2017/021482 filed on Jun. 9, 2017, which claims priority of Japanese Application No. JP 2016-115567 filed on Jun. 9, 2016, the entire content of each of which is incorporated herein by reference.

TECHNICAL FIELD

The present invention relates to a CMP polishing liquid and a polishing method using the same.

BACKGROUND ART

Recently, new microfabrication technologies have been developed along with higher integration and higher performance of semiconductor integrated circuits (hereinafter referred to as "LSI"). Chemical mechanical polishing (hereinafter referred to as "CMP") method is one of the techniques and is a technology frequently used in a LSI manufacturing process, especially, planarization of insulating films, formation of metal plugs, and formation of embedded interconnections in a multilayer interconnection formation process. This technology is disclosed in Patent Document 1, for example.

Recently, in order to improve the performance of LSI, utilization of a metal film of copper or a copper alloy as a conductive substance to be a wiring material has been attempted. However, it is difficult to microfabricate copper or a copper alloy by a dry etching method frequently used in the formation of conventional aluminum alloy wiring.

Accordingly, a method has been mainly adopted in which a metal film of copper or a copper alloy is deposited on and embedded in an insulating film of silicon dioxide or the like in which grooves have been formed in advance, and the metal film located outside the grooves is removed by CMP to form an embedded interconnection, which is the so-called damascene method. This technology is disclosed in Patent Document 2, for example.

On the other hand, as a barrier metal for preventing diffusion of metal into the insulating film and improving adhesion, a layer consisting of a conductor such as tantalum, tantalum alloys, or tantalum nitride is formed under the metal film of copper or a copper alloy, etc. Therefore, it is necessary to remove the exposed barrier metal by CMP in a part other than the wiring part in which a metal film of copper or a copper alloy, etc. is embedded.

However, since these barrier metals have higher hardness than copper or a copper alloy, a sufficient polishing rate cannot be obtained even when polishing is performed by combining polishing materials for copper or a copper alloy, and the flatness of the surface to be polished is often deteriorated. Thus, a two-step polishing method consisting of a first polishing step of polishing a metal film and a second polishing step of polishing a barrier metal has been investigated.

Figure 1:
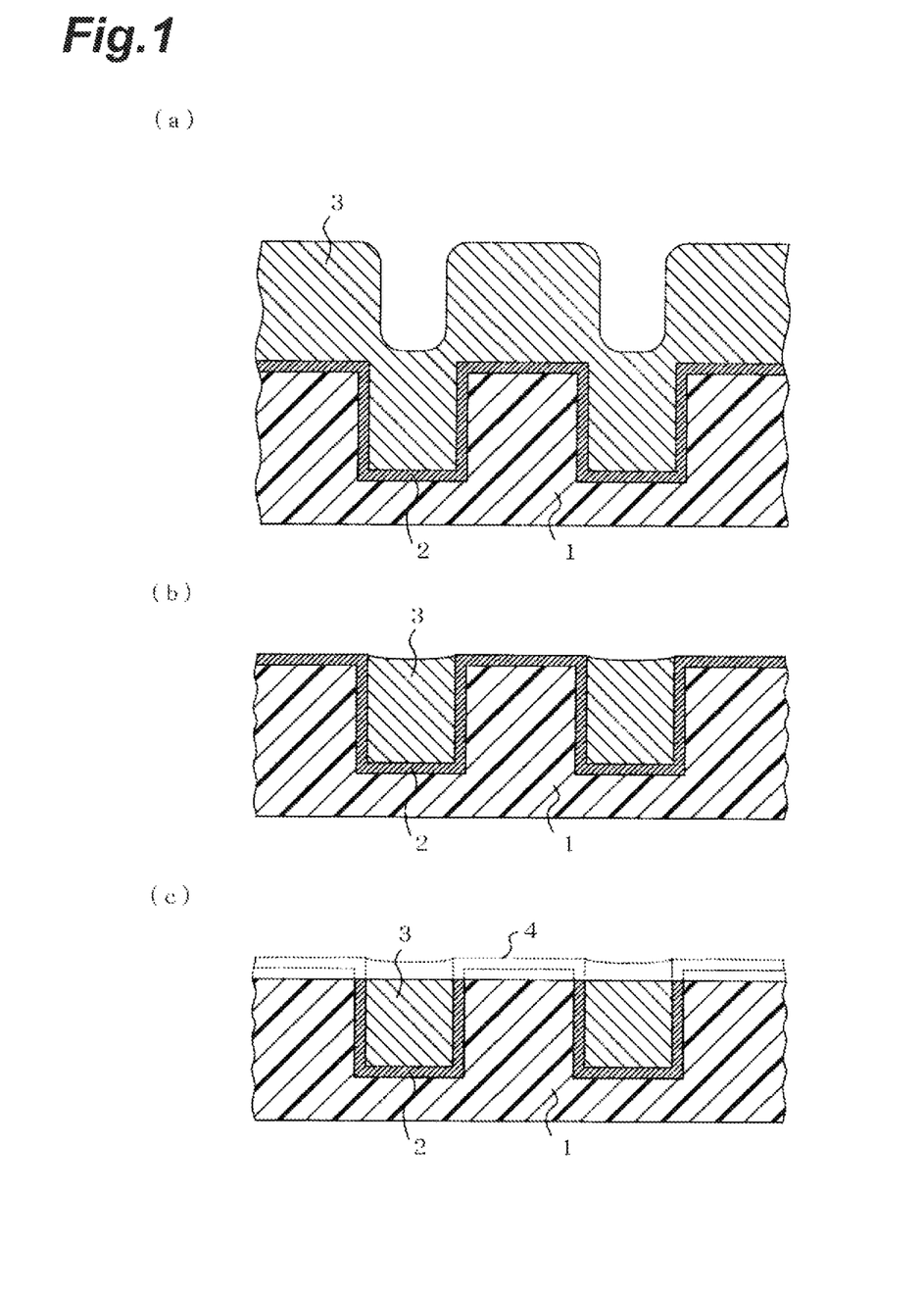
FIG. 1 is a schematic cross-sectional view showing wiring formation by a general damascene process.

FIG. 1 is a schematic cross-sectional view showing a wiring formation by a general damascene process. FIG. 1(a) shows a condition before polishing, which includes an insulating film 1 having grooves formed on the surface thereof, a barrier metal 2 formed so as to follow the surface irregularities of the insulating film 1, and a metal 3 for wiring part of copper or a copper alloy deposited to fill the irregularities.

First, as shown in FIG. 1(b), the metal 3 for wiring part is polished with a polishing liquid for polishing the metal for wiring part until the barrier metal 2 is exposed (the first polishing step). Next, polishing is performed with a polishing liquid for the barrier metal 2 until the convex part of the insulating film 1 is exposed (the second polishing step). In this second polishing step, as shown in FIG. 1(c), overpolishing, i.e. excessively polishing the insulating film, is often performed. In FIG. 1(c), symbol 4 indicates the condition of FIG. 1(b) before the barrier metal polishing in the second polishing step. By such overpolishing, the flatness of the polished surface after polishing can be improved.

Proposals for such a polishing liquid for the barrier metal include a barrier metal polishing liquid containing an oxidizing agent, a protective film forming agent for a metal surface, an acid, and water, the barrier metal polishing liquid having a pH of 3 or less, and the oxidizing agent having a concentration of 0.01 to 3 mass % (for example, see Patent Document 3).

Recently, corrosion of extremely small metal wiring may become a problem along with miniaturization of wiring intervals. Since corrosion of the metal wiring deteriorates the yield of the LSI, the polishing liquid is also required to cause no corrosion of the metal wiring. From the viewpoint of yield, few defects on the metal wiring and the insulating film after polishing are also required.

Furthermore, with the recent miniaturization of the wiring intervals, a problem of wiring delay has arisen. In the integrated circuit, metal wiring is laminated over many layers to transmit signals, and the distance between the wiring becomes short as miniaturization progresses. As a result, the interwiring capacitance between the adjacent wires becomes large and signal delay occurs proportionally to it. This gives rise to a noticeable problem whereby the operation speed of the circuit does not increase but the power consumption does.

In order to overcome this problem, as one of the techniques for lowering the interwiring capacitance, an insulating film having a low dielectric constant material (hereinafter referred to as "low-k film") is sometimes used from an insulating film mainly consisting of silicon dioxide. Examples of the low-k film include organosilicate glasses and wholly aromatic ring low-k films. Compared to silicon dioxide films, these low-k films have disadvantages such as low mechanical strength, high hygroscopicity, low plasma resistance, and low chemical resistance. As a result, the second polishing step has problems such as damage to the low-k film, excessive polishing, and film peeling. In order to overcome the abovementioned problems, it has been proposed to adopt a structure in which a silicon dioxide film is capped on a low-k film. When the silicon dioxide film of the cap layer is included in the insulating film part, the effective relative dielectric constant of the insulating film as a whole is not lowered so much due to the effect of dielectric constant of silicon dioxide. For this reason, it is desirable that the silicon dioxide film as the cap layer is quickly removed at the time of the barrier metal polishing and then the insulating film finally consists of the only low-k film.

Figure 2:
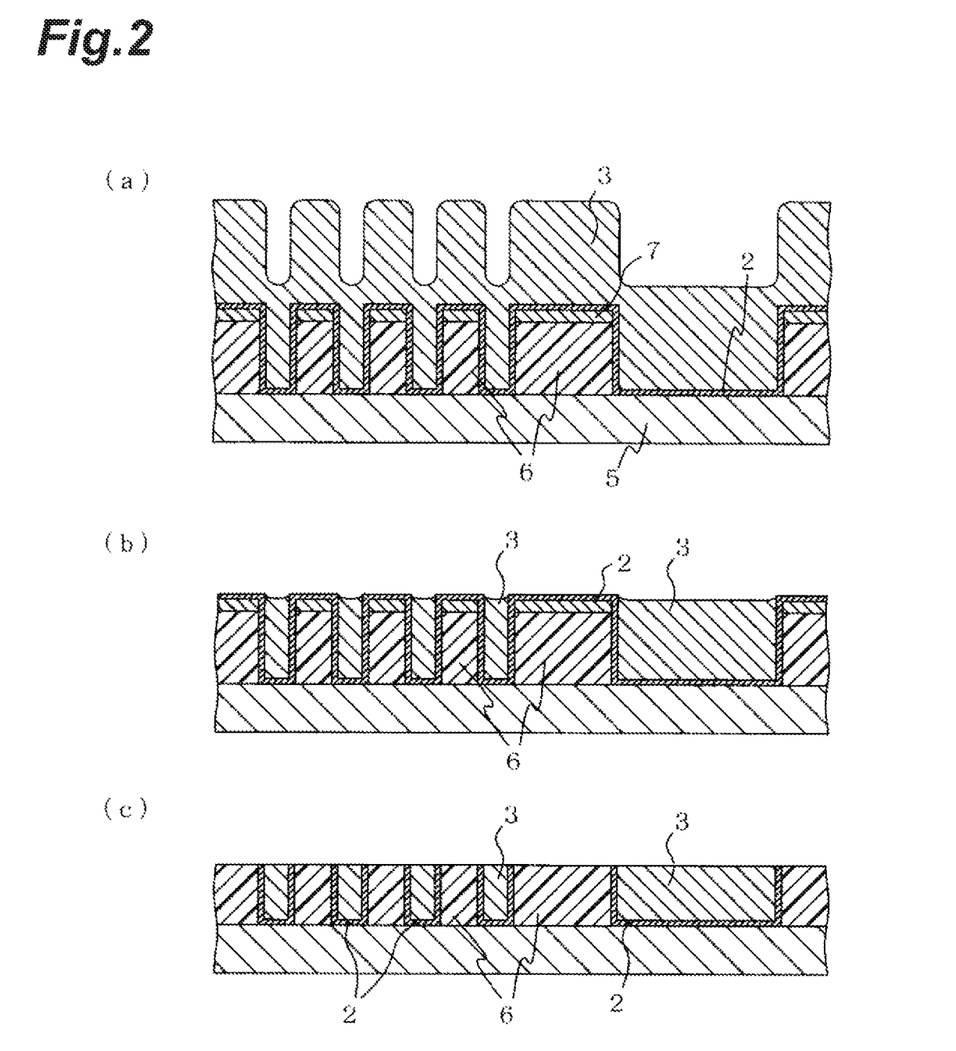
FIG. 2 is a schematic cross-sectional view showing wiring formation using the low-k film and the cap layer as the insulating film.

FIG. 2 is a schematic cross-sectional view showing wiring formation using a low-k film and a cap layer as an insulating film. In order to obtain the structure of FIG. 2(a), a low-k film 6 and a cap layer 7 consisting of silicon dioxide are formed in a laminated structure on a Si substrate 5, and then the raised part and the groove part are formed. The barrier metal 2 is formed thereon so as to follow the raised part and the groove part of the surface, and the wiring part metal 3 deposited entirely so as to fill the raised part and the groove part is formed.

As in FIG. 1, from the condition of the substrate shown in FIG. 2(a) to the condition of the substrate shown in FIG. 2(b), the wiring part metal 3 is polished by the polishing liquid for polishing the wiring part metal until the barrier metal 2 is exposed (the first polishing step). As shown in FIG. 2(c), the barrier metal 2 is polished with the polishing liquid for the barrier metal to reach the condition of the substrate shown in FIG. 2(c), that is, at least the cap layer 7 consisting of silicon dioxide is completely removed and until the low-k film 6 is exposed (the second polishing step).

Accordingly, in the second polishing step, it is necessary to polish the barrier metal, the metal film, and the silicon dioxide film, or the barrier metal, the metal film, the silicon dioxide film which is the cap layer, and the low-k film. The polishing rate for the low-k film tends to be large for reasons such as low mechanical strength and chemical resistance. Since the low-k film should not be excessively removed unlike the cap layer, the polishing rate for the low-k film is required not to be too large. When the polishing rate for the metal film is too large, the central part of the embedded metal wiring is isotopically polished to cause the phenomenon (dishing) in which the central part becomes depressed like a dish. It is thus required also for the polishing rate for the metal film not to be too large.

CITATION LIST

Patent Literature

Patent Document 1: U.S. Pat. No. 4,944,836
Patent Document 2: Japanese Unexamined Patent Publication No. H2-278822
Patent Document 3: International Publication No. WO 01/13417 pamphlet

SUMMARY OF INVENTION

Technical Problem

As described above, the barrier metal, the metal film, and the silicon dioxide film, or the barrier metal, the metal film, the silicon dioxide film as the cap layer, and the low-k film may be polished by using the polishing liquid for the barrier metal. Therefore, a certain uniform polishing rate is required for the polishing liquid for the barrier metal, the metal film, the silicon dioxide film, and the low-k film, and particularly the polishing rates for the metal film and the low-k film are required to be appropriately controlled (not too high). However, since the mechanical strength of the barrier metal or the silicon dioxide is generally relatively high, the polishing rates for the barrier metal and the silicon dioxide film are low and the polishing rates for the metal film and the low-k film tend to be high. For this reason, it is difficult to adapt the CMP polishing liquid for individual films as the polishing target, and to balance the polishing rate for each film.

The present invention has been made in view of the abovementioned problems, and the object of the present invention is to provide a CMP polishing liquid capable of suppressing corrosion of the metal film and occurrence of defects on the metal film and the insulating film and uniformly polishing the barrier metal, the metal film, the silicon dioxide film, and the low-k film at a high polishing rate in the second polishing step polishing the barrier metal, and a polishing method using the polishing liquid.

Solution to Problem

The polishing liquid according to the present invention is a CMP polishing liquid for polishing a substrate comprising at least a barrier metal, a metal film, and a silicon dioxide film, or a substrate comprising at least a barrier metal, a metal film, a silicon dioxide film, and a low-k film, wherein the polishing liquid contains abrasive particles, a metal oxide dissolving agent, an oxidizing agent, a water-soluble polymer, and an alkali metal ion; the surface potentials of the abrasive particles and the metal film have the same sign and the product of the surface potential (mV) of the abrasive particles and the surface potential (mV) of the metal film is 250 to 10000; and pH is 7.0 to 11.0.

In one embodiment of the present invention, it is preferable that the abrasive particles form associated particles, and the average secondary particle diameter of the associated particles is 120 nm or less.

In one embodiment of the present invention, it is preferable that the content of abrasive particles is 1 to 20 mass %.

In one embodiment of the present invention, it is preferable that abrasive particles comprise silica particles.

In one embodiment of the present invention, it is preferable that the metal oxide dissolving agent comprise at least one selected from the group consisting of citric acid, malonic acid, diglycolic acid, isophthalic acid, and methylsuccinic acid.

In one embodiment of the present invention, it is preferable that the water-soluble polymer have a structure of the following formula (1):

$$RO-X_n-Y_m-H \qquad (1)$$

(In the formula, R represents an alkyl group, an alkenyl group, a phenyl group, a polycyclic phenyl group, an alkylphenyl group, or an alkenylphenyl group having 6 or more carbon atoms, X and Y represent an oxyethylene group and an oxypropylene group that optionally have a substituent on a side chain, respectively, n and m each represent an integer of 0 or more, and n+m is an integer of 4 or more).

In one embodiment of the present invention, it is preferable that the alkali metal ion be a potassium ion.

In addition, a polishing method of the present invention is characterized by comprising a step of relatively moving a polishing platen and a substrate in a condition where the substrate is pressed against the polishing cloth, while the abovementioned CMP polishing liquid is supplied onto the polishing cloth of the polishing platen, the substrate comprising at least a barrier metal, a metal film, and a silicon dioxide film, or comprising at least a barrier metal, a metal film, a silicon dioxide film, and a low-k film.

Advantageous Effects of Invention

The present invention can provide the CMP polishing liquid capable of suppressing corrosion of the metal film and occurrence of defects on the metal film and the insulating film, and uniformly polishing the barrier metal, the metal film, the silicon dioxide film and the low-k film at a high polishing rate in the second polishing step of polishing the barrier metal, and the polishing method using the polishing liquid.

DESCRIPTION OF EMBODIMENTS

Hereinafter, preferred embodiments of the present invention will be described. However, the present invention is not limited to the following embodiments at all.

(CMP Polishing Liquid)

The CMP polishing liquid according to the present embodiment contains abrasive particles, a metal oxide dissolving agent and, as a chemical component, a metal corrosion inhibitor, an oxidizing agent, a water-soluble polymer and an alkali metal ion.

(Abrasive Particle)

The primary particle diameter of abrasive particles is preferable to be 80 nm or less, more preferable to be 5 to 70 nm, particularly preferable to be 10 to 65 nm, and extremely preferable to be 15 to 60 nm. The abrasive particles may form associated particles, and the average secondary particle diameter of the associated particles is preferable to be 120 nm or less, more preferable to be 5 to 100 nm, particularly preferable to be 10 to 90 nm, and extremely preferable to be 15 to 80 nm. When the secondary particle diameter exceeds 120 nm, the polishing rate tends to deteriorate. The secondary particle diameter of the abrasive particles is measured using a light diffraction scattering type particle size distribution meter (for example, N5 manufactured by BECKMAN COULTER).

The content of abrasive particles (content based on the total mass of the CMP polishing liquid, the same applies hereinafter) is preferable to be 1 to 20 mass %, more preferable to be 1.5 to 18 mass %, and particularly preferable to be 2.0 to 15 mass %. When the content is less than 1 mass %, the ability to remove the mechanical reaction layer by abrasive particles is insufficient and the polishing rate for the silicon dioxide film and the barrier metal tends to be low.

It is preferable that the abrasive particles comprise silica particles. Conventionally, silica, alumina, ceria, and the like are well known as materials of abrasive particles, but silica is preferable because it is difficult to cause defects on the surface of the metal film and the insulating film after polishing. As the material of abrasive particles, it is also possible to use silicas (for example, particles coated with a polymer on silica surface).

(Metal Oxide Dissolving Agent)

The metal oxide dissolving agent is preferable to be water soluble, and examples thereof include organic acids such as malonic acid, citric acid, malic acid, glycolic acid (diglycolic acid), glutamic acid, glyconic acid, oxalic acid, tartaric acid, picolinic acid, nicotinic acid, mandelic acid, picolinic acid, acetic acid, formic acid, succinic acid, adipic acid, glutaric acid, benzoic acid, quinaldic acid, butyric acid, valeric acid, lactic acid, phthalic acid, fumaric acid, maleic acid, aminoacetic acid, salicylic acid, glyceric acid, and pimelic acid; these organic acid esters; salts of these organic acids; inorganic acids such as sulfuric acid, nitric acid, phosphoric acid, acetic acid, and hydrochloric acid; and salts of these inorganic acids. These can be used singly or in admixture of two or more. Of these, citric acid, malonic acid, diglycolic acid, isophthalic acid, and methylsuccinic acid are preferable from the viewpoint of improving the polishing rate for the barrier metal and the silicon dioxide film. These can be used singly or in combination of two or more.

The content of the metal oxide dissolving agent is preferable to be 0.005 to 5 mass %, more preferable to be 0.01 to 3 mass %, and particularly preferable to be 0.1 to 2 mass %. When this content is less than 0.005 mass %, the effect on improving the polishing rate for the silicon dioxide film is low, and when it exceeds 5 mass %, abrasive particles tend to aggregate and the storage stability tends to decrease.

(Water-Soluble Polymer)

It is preferable that the water-soluble polymer have a structure of the following formula (1):

$$RO-X_n-Y_m-H \quad (1)$$

In the formula, R represents an alkyl group, an alkenyl group, a phenyl group, a polycyclic phenyl group, an alkylphenyl group, or an alkenylphenyl group having 6 or more carbon atoms.

In the formula, X represents an oxyethylene group and Y represents an oxypropylene group. A substituent such as an alkyl group or a phenyl group may be bonded to the side chain in the oxyethylene group or the oxypropylene group. In addition, n and m represent the number of repeating structures of the oxyethylene group and the oxypropylene group, each of n and m is an integer of 0 or more, and n+m is an integer of 4 or more.

The weight average molecular weight of the water-soluble polymer is preferable to be 100 to 30000, more preferable to be 200 to 20000, and particularly preferable to be 300 to 10000. When the molecular weight is less than 100 or exceeds 30000, the effect of adjusting the polishing rate for the low-k film tends to be small. The content thereof is preferable to be 0.001 to 0.5 mass %, more preferable to be 0.002 to 0.3 mass %, and particularly preferable to be 0.004 to 0.2 mass %. When the content is less than 0.001 mass %, the effect of adjusting the polishing rate for the low-k film is small, and when it exceeds 0.5 mass %, abrasive particles tend to aggregate and the storage stability tends to decrease.

(Oxidizing Agent)

In the present embodiment, it is preferable to use an oxidizing agent for adjusting the polishing rate for the metal film. Examples of the oxidizing agent for the metal film in the present embodiment include hydrogen peroxide ($H_2O_2$), potassium periodate, ammonium persulfate, hypochlorous acid, and ozone water. These can be used singly or in combination of two or more, but an oxidizing agent containing no nonvolatile components is desirable, since contamination with halides or the like is undesirable. Among them, hydrogen peroxide is preferable from the viewpoint of stability.

(pH of CMP Polishing Liquid)

The pH of the CMP polishing liquid is preferable to be 7.0 to 11.0, more preferable to be 7.5 to 10.7, and particularly preferable to be 8.0 to 10.5. When the pH is less than 7 or exceeds 11.0, corrosion to the metal film tends to occur.

(Alkali Metal Ion)

As the alkali metal ion of the present embodiment, a lithium ion, a sodium ion, a potassium ion, and a rubidium ion are preferable to be used, and a potassium ion is particularly preferable from the viewpoint of not contaminating the semiconductor device.

An alkali metal ion is used as a pH adjusting agent for the CMP polishing liquid. As a pH adjusting agent containing an alkali metal ion, potassium hydroxide or the like can be suitably used. Ammonia, organic amines, and the like exist as a pH adjusting agent, but when these are used, the polishing rate for the metal film is remarkably deteriorated and odor is likely to occur. There is also a pH adjusting agent containing an alkaline earth metal and the like, but these tend to cause aggregation of abrasive particles.

The alkali metal ion content is preferable to be 0.01 mass % or more, and particularly preferable to be 0.03 mass % or more. From the viewpoint of preventing aggregation of silica, it is preferable to be less than 2 mass % and particularly preferable to be less than 1.9 mass %.

(Surface Potential)

The surface potential (mV) of the metal film formed by a chemical component contained in the CMP polishing liquid and the surface potential (mV) of abrasive particles, obtained by the surface potential measuring device, have the same sign, and the product is preferable to be 250 to 10000, preferable to be 300 to 10000, and particularly preferable to be 400 to 10000. Since the both surface potentials have the same sign and the product is within the above range; abrasive particles electrostatically repel the metal film and the insulating film; adhesion derived from abrasive particles can be suppressed after polishing; and adhesion of abrasive particles can be suppressed, defects on the metal film surface and the insulating film can be suppressed.

(Metal Corrosion Inhibitor)

The CMP polishing liquid according to the present embodiment may contain a metal corrosion inhibitor or the like as other additives. As a metal corrosion inhibitor, the compound capable of forming a chelate complex with a metal and forming a protective film that prevents excessive etching of the metal can be used. As such a compound, a known compound can be used, and examples thereof include a compound having a triazole skeleton, a compound having an imidazole skeleton, a compound having a pyrimidine skeleton, a compound having a guanidine skeleton, a compound having a thiazole skeleton, and a compound having a pyrazole skeleton. These metal corrosion inhibitors can be used singly or in admixture of two or more.

Examples of the compound having a triazole skeleton include 1,2,3-triazole, 1,2,4-triazole, 3-amino-1H-1,2,4-triazole, benzotriazole, 1-hydroxybenzotriazole, 1-dihydroxypropylbenzotriazole, 2,3-dicarboxypropylbenzotriazole, 4-hydroxybenzotriazole, 4-carboxyl(-1H-)benzotriazole, 4-carboxyl(-1H-)benzotriazole methyl ester, 4-carboxyl(-1H-)benzotriazole butyl ester, 4-carboxyl(-1H-)benzotriazole octyl ester, 5-hexylbenzotriazole, [1,2,3-benzotriazolyl-1-methyl][1,2,4-triazolyl-1-methyl][2-ethylhexyl] amine, tolyltriazole, naphthotriazole, bis[(1-benzotriazolyl)methyl] phosphonic acid, 3-aminotriazole, and 5-methylbenzotriazole.

Examples of the compound having an imidazole skeleton include 2-methylimidazole, 2-ethylimidazole, 2-isopropylimidazole, 2-propylimidazole, 2-butylimidazole, 4-methylimidazole, 2,4-dimethylimidazole, 2-ethyl-4-methylimidazole, 2-undecylimidazole, and 2-aminoimidazole.

Examples of the compound having a pyrimidine skeleton include pyrimidine, 1,2,4-triazolo[1,5-a]pyrimidine, 1,3,4,6,7,8-hexahydro-2H-pyrimido[1,2-a]pyrimidine, 1,3-diphenyl-pyrimidine-2,4,6-trione, 1,4,5,6-tetrahydropyrimidine, 2,4,5,6-tetraaminopyrimidine sulfate, 2,4,5-trihydroxy pyrimidine, 2,4,6-triaminopyrimidine, 2,4,6-trichloropyrimidine, 2,4,6-trimethoxypyrimidine, 2,4,6-triphenylpyrimidine, 2,4-diamino-6-hydroxyl pyrimidine, 2,4-diaminopyrimidine, 2-acetamidopyrimidine, 2-aminopyrimidine, 2-methyl-5,7-diphenyl-(1,2,4)triazolo[1,5-a]pyrimidine, 2-methylsulfanyl-5,7-diphenyl-(1,2,4)triazolo[1,5-a]pyrimidine, 2-methylsulfanyl-5,7-diphenyl-4,7-dihydro-(1,2,4)triazolo[1,5-a]pyrimidine, and 4-aminopyrazolo[3,4-d]pyrimidine.

Examples of the compound having a guanidine skeleton include 1,3-diphenylguanidine and 1-methyl-3-nitroguanidine.

Examples of the compound having a thiazole skeleton include 2-mercaptobenzothiazole, 2-aminothiazole, 4,5-dimethylthiazole, 2-amino-2-thiazoline, 2,4-dimethylthiazole, and 2-amino-4-methylthiazole.

Examples of the compound having a pyrazole skeleton include 3,5-dimethylpyrazole, 3-methyl-5-pyrazolone, 3-amino-5-methylpyrazole, 3-amino-5-hydroxypyrazole, and 3-amino-5-methylpyrazole.

Among them, the compound having a triazole skeleton is preferable from the viewpoint of the polishing rate and the etching rate. Among the compounds having a triazole skeleton, 1,2,3-triazole, 1,2,4-triazole, 3-amino-1H-1,2,4-triazole, 4-amino-4H-1,2,4-triazole, benzotriazole, 1-hydroxybenzotriazole, and 5-methylbenzotriazole are more preferable.

The content of the metal corrosion inhibitor is preferable to be 0.001 mass % or more, more preferable to be 0.002 mass % or more, and still more preferable to be 0.004 mass % or more from the viewpoint of easy suppression of etching, and preferable to be 1.0 mass % or less, more preferable to be 0.5 mass % or less, and still more preferable to be 0.3 mass % or less from the viewpoint of obtaining a practical level of polishing rate.

(The Film to be Polished)

Examples of the material of the metal film include those containing metals such as copper, copper alloy, copper oxide or copper alloy oxide, cobalt, cobalt alloy, tungsten, tungsten alloy, silver, and gold as a main component. As the metal film, a film formed by a known sputtering method, a plating method, or the like can be used.

The barrier metal is formed in order to prevent the metal of the wiring metal from diffusing into the insulating film and to improve the adhesion between the insulating film and the wiring metal. The composition of the barrier metal is preferable to be selected from tungsten compounds such as tungsten, tungsten nitride, and tungsten alloys; titanium compounds such as titanium, titanium nitride, and titanium alloys; tantalum compounds such as tantalum, tantalum nitride, and tantalum alloys; ruthenium; ruthenium compounds; cobalt; and cobalt compounds. The barrier metal may have a single layer structure consisting of one of these or a laminated structure consisting of two or more.

As the insulating film, there are the silicon dioxide film and the low-k film. Examples of the low-k film include a silicon-based film and an organic polymer film. Examples of the silicon-based film as the low-k film include a silica-based film such as a silicon oxide film, fluorosilicate glass, organosilicate glass obtained using trimethylsilane or dimethoxydimethylsilane as a starting material, and porous organosilicate glass. Examples of the organic polymer film as the low-k film include a wholly aromatic low dielectric constant interlayer insulating film. From the viewpoint of solving the wiring delay, it is preferable that the dielectric constant is 2.9 or less. Among them, fluorosilicate glasses, organosilicate glasses, porous organosilicate glasses, and the like are particularly used as the low-k film. These films are formed by a CVD method, a spin coating method, a dip coating method, or a spraying method.

The polishing method of the present embodiment is a polishing method in which, while the above CMP polishing liquid is supplied onto a polishing cloth of a polishing platen, the film to be polished is polished by relatively moving the polishing platen and the substrate in a condition where the substrate having the film to be polished is pressed against the polishing cloth. More specifically, the polishing method of the present embodiment is a polishing method that comprises a step of, while the above CMP polishing liquid is supplied onto the polishing cloth of the polishing platen, relatively moving the polishing platen and the substrate in a condition where the substrate is pressed against the polishing cloth, the substrate comprising at least a barrier metal, a metal film, and a silicon dioxide film or comprising at least a barrier metal, a metal film, a silicon dioxide film, and a low-k film. As an apparatus for polishing, for example, a general polishing apparatus having the platen to which the polishing cloth (pad) and a motor or the like capable of changing the rotation speed are attached and having a holder for holding the substrate can be used. The polishing cloth is not particularly limited, but general nonwoven fabric, foamed polyurethane, porous fluororesin, or the like can be used. The polishing conditions are not particularly limited, but it is preferable to set the rotation speed of the platen to a low rotation of 200 rpm or less so that the substrate does not jump out.

The polishing pressure on the polishing cloth of the substrate having the film to be polished is preferable to be 3 to 100 kPa, and more preferable to be 5 to 50 kPa from the viewpoint of uniformity of the polishing rate in the substrate surface and flatness of the pattern. It is preferable to continuously supply the CMP polishing liquid to the polishing cloth with a pump or the like during polishing. This supply amount is not limited, but it is preferable that the surface of the polishing cloth is always covered with the polishing liquid. In order to carry out chemical mechanical polishing with the surface condition of the polishing cloth always kept constant, it is preferable to put the conditioning step of the polishing cloth before polishing or during polishing. For example, conditioning of the polishing cloth is performed with a liquid containing at least water by using a dresser having diamond particles. Subsequently, it is preferable to carry out the polishing method of the present embodiment and further add a substrate cleaning step.

EXAMPLES

Hereinafter, the present invention will be described in detail by examples, but the present invention is not limited to these examples.

Examples 1 to 4 and Comparative Examples 1 to 5

The silica described in Table 1 was used as abrasive particles. The average secondary particle diameter (average secondary particle diameter of associated particles) of the silica (silica A and silica B) described in Table 1 was measured using N5 manufactured by BECKMAN COULTER. For the measuring method, a photon correlation method was used, and the material containing silica was diluted so that the scattering intensity was $5.0 \times 10^4$ to $1.0 \times 10^6$ cps, and the material was placed in a plastic cell and the particle diameter was measured.

TABLE 1

| | Average secondary particle diameter (nm) |
|---|---|
| Silica A | 66 |
| Silica B | 61 |

Example 1

Malonic acid of 0.4 mass %, 0.0065 mass % of BTA (benzotriazole), and 0.0065 mass % of polyoxyethylene tridecyl ether (n=8 and m=0 in the above formula (1), the same applies to the following) were added to deionized water, and this was added with 1.5 mass % of KOH, then 7.5 mass % of silica A, and finally 0.1 mass % of hydrogen peroxide to prepare the CMP polishing liquid 1. The pH of the CMP polishing liquid was 10.

Example 2

Diglycolic acid of 0.4 mass %, 0.0065 mass % of HBTA (1-hydroxybenzotriazole), and 0.0065 mass % of polyoxyethylene tridecyl ether were added to deionized water, and this was added with 1.26 mass % of KOH, then 7.5 mass % of silica A, and finally 0.1 mass % of hydrogen peroxide to prepare the CMP polishing liquid 2. The pH of the CMP polishing liquid was 10.

Example 3

Diglycolic acid of 0.22 mass %, 0.0040 mass % of HBTA, and 0.0065 mass % of polyoxyethylene tridecyl ether were added to deionized water, and this was added with 0.73 mass % of KOH, then 5.0 mass % of silica B, and finally 0.1 mass % of hydrogen peroxide to prepare the CMP polishing liquid 3. The pH of the CMP polishing liquid was 10.

Example 4

Malonic acid of 0.40 mass % and 0.0065 mass % of polyoxyethylene tridecyl ether were added to deionized water, and this was added with 1.50 mass % of KOH, then 7.5 mass % of silica A, and finally 0.1 mass % of hydrogen peroxide to prepare the CMP polishing liquid 4. The pH of the CMP polishing liquid was 10.

Comparative Example 1

The CMP polishing liquid 5 was prepared in the same manner as in Example 1 except that malonic acid was not added as a metal oxide dissolving agent and the addition amount of KOH as a pH adjusting agent was changed to 0.35 mass %. The pH of the CMP polishing liquid 5 was 10.

Comparative Example 2

The CMP polishing liquid 6 was prepared in the same manner as in Example 1 except that polyoxyethylene tridecyl ether was not added as an organic compound. The pH of the CMP polishing liquid 6 was 10.

Comparative Example 3

The CMP polishing liquid 7 was prepared in the same manner as in Example 1 except that KOH as the alkali metal ion source and a pH adjusting agent was changed to monoethanolamine. The pH of the CMP polishing liquid 7 was 10.

Comparative Example 4

The CMP polishing liquid 8 was prepared in the same manner as in Example 1 except that hydrogen peroxide was not added as an oxidizing agent. The pH of the CMP polishing liquid 8 was 10.

Comparative Example 5

Malonic acid of 0.4 mass %, 0.0065 mass % of BTA, and 0.0065 mass % of polyoxyethylene tridecyl ether were added to deionized water, and this was added with 0.05 mass % of KOH, then 3.0 mass % of silica A, and finally 0.1 mass % of hydrogen peroxide to prepare the CMP polishing liquid 9. The pH of the CMP polishing liquid 9 was 3.0.

(Polishing Condition)

Polishing pad: H 7000 (Fujibo Co., Ltd.)

Polishing pressure: 10.3 kPa

Platen rotation speed: 90 rpm

Head rotation speed: 87 rpm

Polishing liquid supply amount: 300 ml (Polishing Rate Evaluation Substrate)

Metal film: A 12-inch Cu substrate having copper (Cu) film of 1500 nm in thickness formed on a silicon substrate Barrier metal: A 12-inch TaN substrate having tantalum nitride (TaN) film of 200 nm in thickness formed on a silicon substrate Low-k film: A 12 inch low-k substrate having low-k film of 500 nm in thickness formed on a silicon substrate (trade name "Black Diamond", manufactured by Applied Materials, Inc.)

Silicon dioxide film (cap film): A 12-inch TEOS substrate having a TEOS film of 1000 nm in thickness formed on a silicon substrate (Polishing Rate and Selectivity Ratio)

The Cu polishing rate and the polishing rate for TaN were determined by calculating the difference in film thickness between before and after CMP of Cu and TaN from the electric resistance value obtained using the resistance measuring device, VR-120/08S (manufactured by Hitachi Kokusai Electric Inc.). TEOS and low-k were determined from the film thickness difference before and after polishing using the optical interference film thickness measuring device, F80 (manufactured by Filmetrics). In the CMP under the same conditions, the polishing rate for Cu/TaN/low-k/TEOS is preferable to be (20 to 120 nm/min)/(40 to 120 nm/min)/(40 to 120 nm/min)/(40 to 120 nm/min).

As the selectivity ratio of the polishing rate, the polishing rate ratio for Cu/TaN/low-k film/TEOS is preferable to be (0.3 to 1.5)/1.0/(0.5 to 2.0)/(0.3 to 1.5).

(Evaluation of Corrosion Rate of Cu)

The corrosion rate of Cu was calculated from difference in film thickness before and after immersion and immersion time obtained by attaching a Cu substrate cut to 20 mm square to a stirring spring and immersing the Cu substrate in a polishing liquid warmed at 60° C. for 5 minutes at 100 rpm of the rotational speed of the stirring spring.

(Method for Measuring Surface Potential)

The surface potential of silica was measured using the surface potential measuring device, Delsa Nano C manufactured by BECKMAN COULTER. For the measurement method, laser Doppler multipoint detection type electrophoresis method was used, and the measurement range was ±100 mV. The polishing liquid was diluted so that the scattering intensity became $1.0 \times 10^4$ to $5.0 \times 10^4$ cps, and placed in a quartz cell for measuring the surface potential of the dilute solution, and measurement was carried out at 25° C.

Since Cu is assumed to be copper oxide by the oxidizing agent upon polishing, the surface potential was measured by adding 1 mass % of copper oxide (II) powder (manufactured by KANTO CHEMICAL CO., INC.) in the CMP polishing liquid without abrasive particles, being kept for 5 minutes, collecting the supernatant with a pipette, and injecting 3 mL of the supernatant into a measurement cell.

(Evaluation of Defects on Cu (Metal Film) and TEOS (Insulating Film) Surface)

The number of surface defects of Cu and TEOS was measured under the following conditions using LS 6700 manufactured by Hitachi Electronics Engineering Co., Ltd. The number of surface defects after polishing/the number of surface defects before polishing was calculated, and the number of 2.0 or more was judged to be defective.

Defect measurement range of Cu surface: 0.200 µm-0.370 µm

Defect measurement range of TEOS surface: 0.200 µm-0.808 µm

In Examples 1 to 4 and Comparative Examples 1 to 5, the evaluation results for the polishing rate and the selectivity ratio of the polishing rate for Cu, TaN, low-k, and TEOS; surface potential of Cu and silica and its product; the corrosion rate of Cu; and the ratio of the number of Cu and TEOS surface defects before and after polishing are shown in Tables 2 and 3.

TABLE 2

| | Item | Example 1 | Example 2 | Example 3 | Example 4 |
|---|---|---|---|---|---|
| Composition | Abrasive grain | Silica A | Silica A | Silica B | Silica A |
| | Content (mass %) | 7.5 | 7.5 | 5.0 | 7.5 |
| | Metal oxide dissolving agent | Malonic acid | Diglycolic acid | Diglycolic acid | Malonic acid |
| | Content (mass %) | 0.40 | 0.40 | 0.22 | 0.40 |
| | Metal corrosion inhibitor | BTA | HBTA | HBTA | — |
| | Content (mass %) | 0.0065 | 0.0065 | 0.0040 | — |
| | Water-soluble polymer | Polyoxyethylene tridecyl ether | Polyoxyethylene tridecyl ether | Polyoxyethylene tridecyl ether | Polyoxyethylene tridecyl ether |
| | Content (mass %) | 0.0065 | 0.0065 | 0.0065 | 0.0065 |
| | pH adjusting agent | KOH | KOH | KOH | KOH |
| | Content (mass %) | 1.50 | 1.26 | 0.73 | 1.50 |
| | Alkali metal ion | Potassium | Potassium | Potassium | Potassium |
| | Content (mass %) | 0.51 | 0.43 | 0.16 | 0.51 |
| | Oxidizing agent (hydrogen peroxide) (mass %) | 0.1 | 0.1 | 0.1 | 0.1 |
| | pH | 10.0 | 10.0 | 10.0 | 10.0 |
| Polishing rate | Cu (nm/min) | 87 | 69 | 49 | 98 |
| | TaN (nm/min) | 77 | 71 | 56 | 79 |
| | low-k (nm/min) | 99 | 104 | 53 | 99 |
| | TEOS (nm/min) | 84 | 78 | 49 | 84 |
| Selectivity ratio | Cu/TaN/low-k/TEOS | 1.1/1.0/1.3/1.1 | 1.0/1.0/1.5/1.1 | 0.9/1.0/0.9/0.9 | 1.2/1.0/1.3/1.1 |

TABLE 2-continued

| | Item | Example 1 | Example 2 | Example 3 | Example 4 |
|---|---|---|---|---|---|
| Surface potential | Cu (mV) | −17 | −20 | −22 | −18 |
| | Silica (mV) | −52 | −49 | −35 | −47 |
| | Product of surface potential | 884 | 980 | 770 | 846 |
| Corrosion rate of Cu (60° C.) | | ≤1.0 | ≤1.0 | ≤1.0 | ≤1.0 |
| Ratio of surface defect number before and after polishing | Cu | 1.43 | 1.32 | 0.82 | 0.75 |
| | TEOS | 0.66 | 0.52 | 0.82 | 0.70 |

TABLE 3

| | Item | Comparative Example 1 | Comparative Example 2 | Comparative Example 3 | Comparative Example 4 | Comparative Example 5 |
|---|---|---|---|---|---|---|
| Composition | Abrasive grain | Silica A | Silica A | Silica A | Silica A | Silica A |
| | Content (mass %) | 7.5 | 7.5 | 7.5 | 7.5 | 3.0 |
| | Metal oxide dissolving agent | — | Malonic acid | Malonic acid | Malonic acid | Malonic acid |
| | Content (mass %) | — | 0.40 | 0.40 | 0.40 | 0.40 |
| | Metal corrosion inhibitor | BTA | BTA | BTA | BTA | BTA |
| | Content (mass %) | 0.0065 | 0.0065 | 0.0065 | 0.0065 | 0.0065 |
| | Water-soluble polymer | Polyoxyethylene tridecyl ether | — | Polyoxyethylene tridecyl ether | Polyoxyethylene tridecyl ether | Polyoxyethylene tridecyl ether |
| | Content (mass %) | 0.0065 | — | 0.0065 | 0.0065 | 0.0065 |
| | pH adjusting agent | KOH | KOH | Monoethanolamine | KOH | KOH |
| | Content (mass %)) | 0.35 | 1.50 | 1.95 | 1.50 | 0.05 |
| | Alkali metal ion | Potassium | Potassium | — | Potassium | Potassium |
| | Content (mass %) | 0.12 | 0.51 | — | 0.51 | 0.10 |
| | Oxidizing agent (hydrogen peroxide) (mass %) | 0.1 | 0.1 | 0.1 | — | 0.1 |
| | pH | 10.0 | 10.0 | 10.0 | 10.0 | 3.0 |
| Polishing rate | Cu (nm/min) | 41 | 67 | 242 | 10 | 83 |
| | TaN (nm/min) | 20 | 56 | 58 | 58 | 72 |
| | low-k (nm/min) | 15 | 159 | 95 | 95 | 49 |
| | TEOS (nm/min) | 15 | 70 | 63 | 63 | 68 |
| Selectivity ratio | Cu/TaN/low-k/TEOS | 2.1/1.0/0.8/0.8 | 1.2/1.0/2.8/1.2 | 4.2/1.0/1.6/1.1 | 0.2/1.0./1.6/1.1 | 1.2/1.0/0.7/0.9 |
| Surface potential | Cu (mV) | — | — | — | — | −30 |
| | Silica (mV) | — | — | — | — | 2 |
| | Product of surface potential | — | — | — | — | −60 |
| Corrosion rate of Cu (60° C.) | | ≤1.0 | ≤1.0 | ≤1.0 | ≤1.0 | ≤15 |
| Ratio of surface defect number before and after polishing | Cu | — | — | — | — | 0.98 |
| | TEOS | — | — | — | — | 2.09 |

(Evaluation Result)

In Examples 1 to 4, the polishing rates for TaN and TEOS were high, the polishing rates for Cu and low-k were also comparable to those for TaN and TEOS, and both the polishing rate and the selectivity ratio of polishing rate were good. There was no corrosion of Cu, and the defects of Cu and TEOS surfaces also had low values. On the other hand, in Comparative Example 1 in which the metal oxide dissolving agent was not added, the polishing rates for TEOS and TaN were extremely low values. In Comparative Example 2 in which no water-soluble polymer was added, the polishing rate for low-k was 159 nm/min, which was a very large value. In Comparative Example 3, monoethanolamine was used instead of potassium hydroxide, which is a pH adjusting agent as a potassium ion source, but the polishing rate for Cu significantly increased. In Comparative Example 4, no oxidizing agent was added, but the polishing rate for Cu was significantly low. In Comparative Example 5, although the product of the surface potential had a negative value, the corrosion rate to Cu was high and the number of defects on the TEOS surface also became high.

From the above results, the CMP polishing liquid and the polishing method of the present invention can not only polish TaN (barrier metal) and TEOS (insulating film or cap layer) at high speed, but also control the polishing rate for Cu (metal film) and low-k (low dielectric constant film) appropriately (so that the polishing rate does not become too high). The CMP polishing liquid of the present invention does not corrode Cu (metal film) and can suppress defects on the surfaces of Cu (metal film) and TEOS (insulating film).

REFERENCE SIGNS LIST

1: Insulating film
2: Barrier metal
3: Wiring part metal
5: Si substrate
6: Low-k film
7: Cap layer

The invention claimed is:

1. A polishing method using a CMP polishing liquid, comprising a step of relatively moving a polishing platen and a substrate in a condition where the substrate is pressed against the polishing cloth, while the CMP polishing liquid is supplied onto the polishing cloth of the polishing platen, the substrate comprising at least a barrier metal, a metal film, and a silicon dioxide film or comprising at least a barrier metal, a metal film, a silicon dioxide film, and a low-k film, wherein the metal film comprises one or more of copper, copper alloy, copper oxide, and copper alloy oxide, the CMP polishing liquid contains abrasive particles, a metal oxide dissolving agent, an oxidizing agent, a water-soluble polymer, and an alkali metal ion; pH of the CMP polishing liquid is 7.0 to 11.0; and surface potentials of the abrasive particles and the metal film have the same sign and a product of the surface potential (mV) of the abrasive particles and the surface potential (mV) of the metal film is 300 to 980 mV$^2$ upon polishing.

2. The method according to claim 1, wherein the abrasive particles form associated particles and an average secondary particle diameter of the associated particles is 120 nm or less.

3. The method according to claim 1, wherein a content of the abrasive particles is 1 to 20 mass %.

4. The method according to claim 1, wherein the abrasive particles comprise silica particles.

5. The method according to claim 1, wherein the metal oxide dissolving agent comprises at least one selected from the group consisting of citric acid, malonic acid, diglycolic acid, isophthalic acid, and methylsuccinic acid.

6. The method according to claim 1, the water-soluble polymer has a structure of the following formula (1):

(1)

wherein R represents an alkyl group, an alkenyl group, a phenyl group, a polycyclic phenyl group, an alkylphenyl group, or an alkenylphenyl group having 6 or more carbon atoms; X and Y represent an oxyethylene group and an oxypropylene group that optionally have a substituent on a side chain, respectively; n and m each represent an integer of 0 or more; and n+m is an integer of 4 or more.

7. The method according to claim 1, wherein the alkali metal ion is a potassium ion.

8. A polishing method comprising:
polishing a substrate with a CMP polishing liquid,
the substrate comprising a barrier metal, a metal film, and a silicon dioxide film, the metal film comprising one or more of copper, copper alloy, copper oxide, or copper alloy oxide,
the CMP polishing liquid containing abrasive particles, a metal oxide dissolving agent, an oxidizing agent, a water-soluble polymer, and an alkali metal ion component,
pH of the CMP polishing liquid being 7.0 to 11.0, and
surface potentials of the abrasive particles and the metal film having the same sign and a product of the surface potential (mV) of the abrasive particles and the surface potential (mV) of the metal film being 300 to 980 mV$^2$ upon polishing the substrate with the CMP polishing liquid.

9. The method of claim 8, wherein the substrate further comprises a low-k film.

10. The method according to claim 8, wherein the abrasive particles form associated particles and an average secondary particle diameter of the associated particles is 120 nm or less.

11. The method according to claim 8, wherein a content of the abrasive particles is 1 to 20 mass %.

12. The method according to claim 8, wherein the abrasive particles comprise silica particles.

13. The method according to claim 8, wherein the metal oxide dissolving agent comprises at least one selected from the group consisting of citric acid, malonic acid, diglycolic acid, isophthalic acid, and methylsuccinic acid.

14. The method according to claim 8, the water-soluble polymer has a structure of the following formula (1):

(1)

wherein R represents an alkyl group, an alkenyl group, a phenyl group, a polycyclic phenyl group, an alkylphenyl group, or an alkenylphenyl group having 6 or more carbon atoms; X and Y represent an oxyethylene group and an oxypropylene group that optionally have a substituent on a side chain, respectively; n and m each represent an integer of 0 or more; and n+m is an integer of 4 or more.

15. The method according to claim 8, wherein the alkali metal ion component comprises a potassium ion.

* * * * *